United States Patent
Rogers et al.

(10) Patent No.: US 12,177,968 B2
(45) Date of Patent: Dec. 24, 2024

(54) METHOD OF FORMING A FLEXIBLE ELECTRONICS ASSEMBLY

(71) Applicant: THE BOEING COMPANY, Chicago, IL (US)

(72) Inventors: John E. Rogers, Owens Cross Roads, AL (US); John D. Williams, Decatur, AL (US)

(73) Assignee: The Boeing Company, Chicago, IL (US)

( * ) Notice: Subject to any disclaimer, the term of this patent is extended or adjusted under 35 U.S.C. 154(b) by 35 days.

(21) Appl. No.: 16/839,565

(22) Filed: Apr. 3, 2020

(65) Prior Publication Data
US 2021/0315099 A1    Oct. 7, 2021

(51) Int. Cl.
| | |
|---|---|
| H05K 1/02 | (2006.01) |
| H05K 1/03 | (2006.01) |
| H05K 1/05 | (2006.01) |
| H05K 1/11 | (2006.01) |
| H05K 1/18 | (2006.01) |

(52) U.S. Cl.
CPC ......... *H05K 1/0281* (2013.01); *H05K 1/0271* (2013.01); *H05K 1/0393* (2013.01); *H05K 1/05* (2013.01); *H05K 1/115* (2013.01); *H05K 1/189* (2013.01); *H05K 2201/0183* (2013.01); *H05K 2201/05* (2013.01); *H05K 2201/093* (2013.01)

(58) Field of Classification Search
CPC .......... H05K 1/02; H05K 1/18; H05K 1/0281; H05K 1/0271; H05K 1/0393; H05K 1/05

USPC ......................................................... 174/254
See application file for complete search history.

(56) References Cited

U.S. PATENT DOCUMENTS

| | | | | |
|---|---|---|---|---|
| 5,119,047 | A * | 6/1992 | Brown ................. | H05K 9/0039 174/380 |
| 6,535,090 | B1 * | 3/2003 | Matsuzuka ............. | H01P 5/187 333/125 |
| 10,256,522 | B2 * | 4/2019 | Zhai ..................... | H01Q 21/065 |
| 2008/0297422 | A1 * | 12/2008 | Ishida ...................... | H01Q 1/38 343/702 |
| 2021/0050312 | A1 * | 2/2021 | Franson ............... | H01Q 1/2283 |

OTHER PUBLICATIONS

Yim, M.J., et al., "Microwave model of anisotropic conductive film flip-chip interconnections for high frequency applications," IEEE Transactions on Components and Packaging Technologies, Dec. 1999.

Yim, M.J., et al., "Flip chip interconnection with anisotropic conductive adhesives for RF and highfrequency applications," IEEE Transactions on Components and Packaging Technologies, Dec. 2005.

Gutierrez, C., et al., "CubeSat fabrication through additive manufacturing and micro-dispensing," International Symposium on Microelectronics, 2011.

(Continued)

*Primary Examiner* — Tremesha W Burns
(74) *Attorney, Agent, or Firm* — Joseph M. Butscher; The Small Patent Law Group, LLC

(57) ABSTRACT

A flexible electronics assembly including a substrate including one or more dielectrics. A cavity is formed within the substrate. A first ground plane is secured to the substrate. One or more stress channels are formed through one or more portions of the substrate and the first ground plane. An electronics component is disposed within the cavity.

24 Claims, 7 Drawing Sheets

(56) References Cited

OTHER PUBLICATIONS

Tehrani, B.K., et al., "Inkjet-printed 3D interconnects for millimeter-wave system-on-package solutions," IEEE International Microwave Symposium, May 2016.
Taylor, C.L., et al., "Low-temperature assembly of surface-mount device on flexible substrate using additive printing process," 2018 IEEE 68th Electronic Components and Technology Conference, May 2018.
Merkle, T., et al., "Polymer multichip module process using 3-D printing technologies for D-band applications," IEEE Transactions on Microwave Theory and Techniques, Feb. 2015.

\* cited by examiner

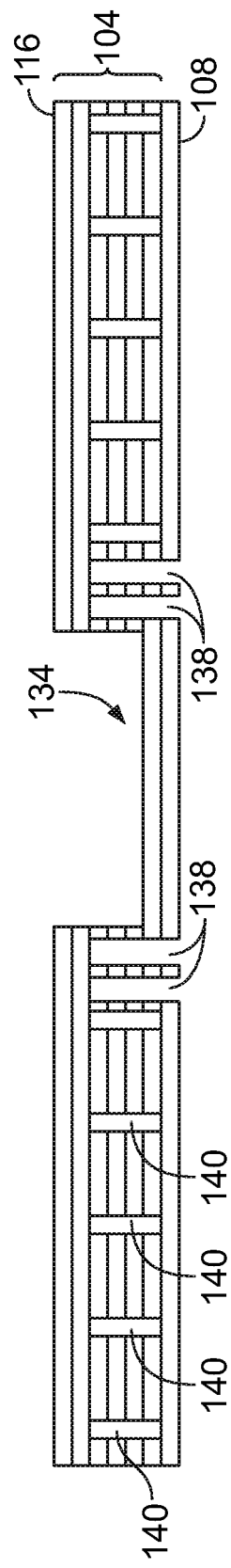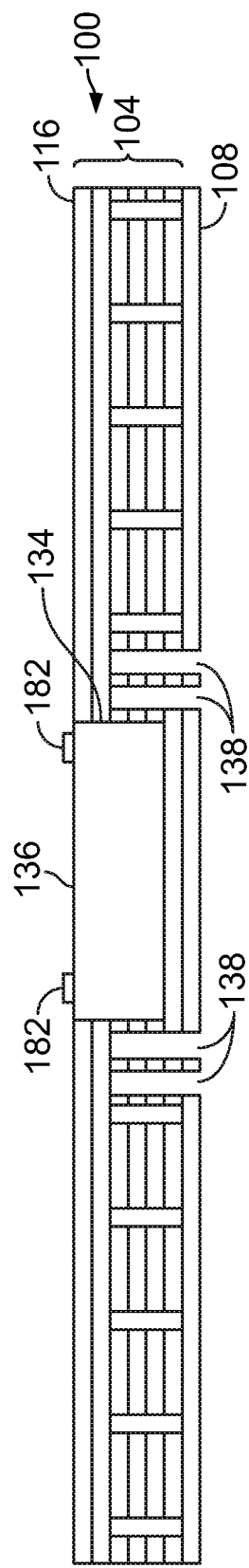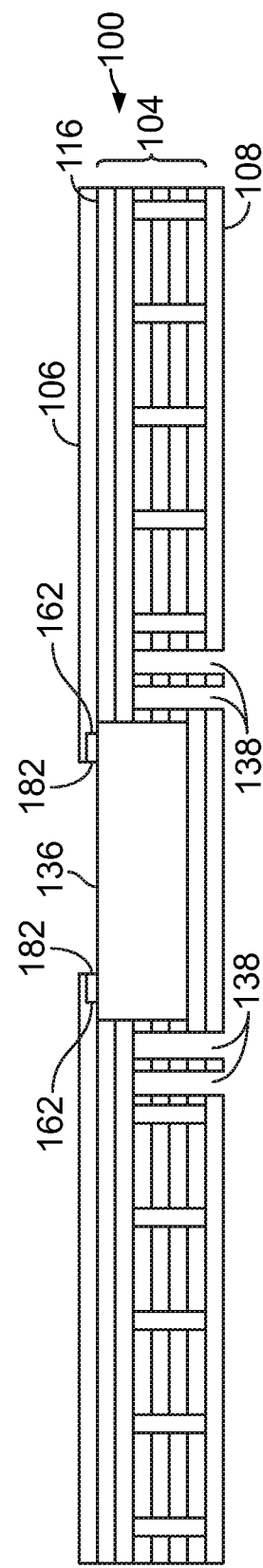

METHOD OF FORMING A FLEXIBLE ELECTRONICS ASSEMBLY

This invention was made with Government support under FHE-MII CONSORTIUM-DEVELOPMENT AGREEMENT-FAA. The Government has certain rights in this invention.

FIELD OF EMBODIMENTS OF THE DISCLOSURE

Embodiments of the present disclosure generally relate to a flexible electronics assembly, and a method of forming a flexible electronics assembly.

BACKGROUND OF THE DISCLOSURE

Flexible hybrid electronics (FHE) combine the functionality of rigid printed circuit boards with the adaptability of flexible circuits. FHEs are becoming increasingly desirable due to their potential to provide flexible, low-size, low-weight, low-power, and low-cost sensors and systems.

Certain FHEs may be formed through additive manufacturing techniques. However, known additive printing techniques may not effectively integrate electronics onto FHE boards. Further, FHEs formed through known techniques may not effectively dissipate heat away from high power electronics, such as power amplifiers.

Known methods for attaching packaged and die electronics to FHE boards include face-up methods and face-down methods. Face-down methods typically utilize anisotropic conductive films or pastes to provide conductive spheres, which may not effectively dissipate heat in relation to an FHE assembly. Face-up methods typically utilize printed lines to attach to portions of electronics, but also may not effectively dissipate heat. For example, the printed lines are typically not adequately connected to a ground plane.

Moreover, certain FHE assemblies may be formed through chemical deposition (such as chemical vapor deposition, plasma enhanced chemical vapor deposition, atomic layer deposition, or molecular layer deposition) or physical deposition (such as physical vapor deposition, thermal evaporation, or sputtering deposition) methods. However, such methods are typically conduced in a clean room, which increases manufacturing costs, and also have low deposition rate and high material waste, which increases manufacturing costs.

Moreover, the integration of electronics to FHE boards typically results in joints between the electronics and FHE boards that are points where mechanical stress due to bending may cause joint failure. Conventional methods for integrating electronics with rigid printed circuit boards (PCBs) typically involve use of solder as the joint. However, solder is a rigid material with little to no ability to accommodate mechanical stress due to bending, which results in joint failure. Stretchable adhesives and stretchable conductive inks have been developed to accommodate mechanical stress due to stretching, bending, flexing, and twisting. However, even such stretchable adhesives and conductive inks have their limits on how much they can stretch.

SUMMARY OF THE DISCLOSURE

A need exists for an effective method for forming an electronics assembly, such as an FHE assembly, which is configured to readily adapt to a surface of a component, and configured to effectively dissipate heat generated by an electronics component. Further, a need exists for a cost-effective method of forming an electronics assembly, such as an FHE assembly. Also, a need exists for a system and method of accommodating mechanical stress within an FHE board itself during bending.

With those needs in mind, certain embodiments of the present disclosure provide a flexible electronics assembly including a substrate including one or more dielectrics. A cavity is formed within a portion of the substrate. A first ground plane is secured to the substrate. One or more stress channels are formed through one or more portions of the substrate and the first ground plane. An electronics component is disposed within the cavity.

In at least one embodiment, a conductor is secured to the substrate. The substrate is disposed between the conductor and the first ground plane.

In at least one embodiment, the dielectrics include a first dielectric, a second dielectric secured to the first dielectric, a third dielectric secured to the second dielectric, a fourth dielectric secured to the third dielectric, and a fifth dielectric secured to the fourth dielectric. In at least one embodiment, the cavity extends through portions of the first dielectric, the second dielectric, the third dielectric, and the fourth dielectric. In at least one embodiment, the stress channel(s) extend through portions of the second dielectric, the third dielectric, the fourth dielectric, the fifth dielectric, and the first ground plane. In at least one embodiment, a second ground plane is secured to the first dielectric. One or more vias may connect the first ground plane to the second ground plane.

In at least one embodiment, the stress channel(s) are offset from the cavity.

In at least one embodiment, the stress channels include one or more inboard stress channels, and one or more outboard stress channels. The inboard stress channel(s) are closer to the cavity than the outboard stress channel(s).

As an example, the inboard stress channels include a first inboard stress channel offset from a first side of the cavity, a second inboard stress channel offset from a second side of the cavity, a third inboard stress channel offset from a third side of the cavity, and a fourth inboard stress channel offset from a fourth side of the cavity. As a further example, the outboard stress channels include a first outboard stress channel offset from the first inboard stress channel, a second outboard stress channel offset from the second inboard stress channel, a third outboard stress channel offset from the third inboard stress channel, and a fourth outboard stress channel offset from the fourth inboard stress channel.

Certain embodiments of the present disclosure provide a method of forming a flexible electronics assembly. The method includes forming a cavity within a portion of a substrate comprising one or more dielectrics; securing a first ground plane to the substrate; forming one or more stress channels through one or more portions of the substrate and the first ground plane; and disposing an electronics component within the cavity.

BRIEF DESCRIPTION OF THE DRAWINGS

FIG. 9 illustrates a cross-sectional view of vias formed in the substrate between the first dielectric and the second ground plane through line 3-3 of FIG. 2, according to an embodiment of the present disclosure.

FIG. 10 illustrates a cross-sectional view of an electronics component disposed within a cavity of the flexible electronics assembly, through line 3-3 of FIG. 2, according to an embodiment of the present disclosure.

FIG. 11 illustrates a cross-sectional view of a conductor disposed over the substrate through line 3-3 of FIG. 2, according to an embodiment of the present disclosure.

DETAILED DESCRIPTION OF THE DISCLOSURE

The foregoing summary, as well as the following detailed description of certain embodiments, will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Certain embodiments of the present disclosure provide a flexible electronics assembly that has improved flexibility, thereby allowing the flexible electronics assembly to readily conform to a surface of a structure. In at least one embodiment, the flexible electronics assembly includes a cavity extending through a substrate that includes one or more dielectric layers or boards, a ground plane, and one or more stress channels (that is, stress-reducing channels) extending through one or more of the dielectric layer(s). A conductors is disposed over the dielectric layer(s).

The cavity may be formed in the substrate through subtractive methods (for example, laser etching or milling). A conductor may be printed on a top surface of the substrate. Electrical interconnects (for example, vias) are configured to electrically short a coplanar ground plane to one or more lower ground planes (for example, two different ground planes). The stress channels may also be formed through subtractive methods. The stress channels relieve or otherwise reduce stress exerted into the flexible electronics assembly, such as when the flexible electronics assembly is flexed. The flexible electronics assembly can be formed through one or more subtractive methods (for example, laser etching, milling, wet etching, or the like) and/or additive methods (for example, printing, film deposition, or the like).

Figure 1:
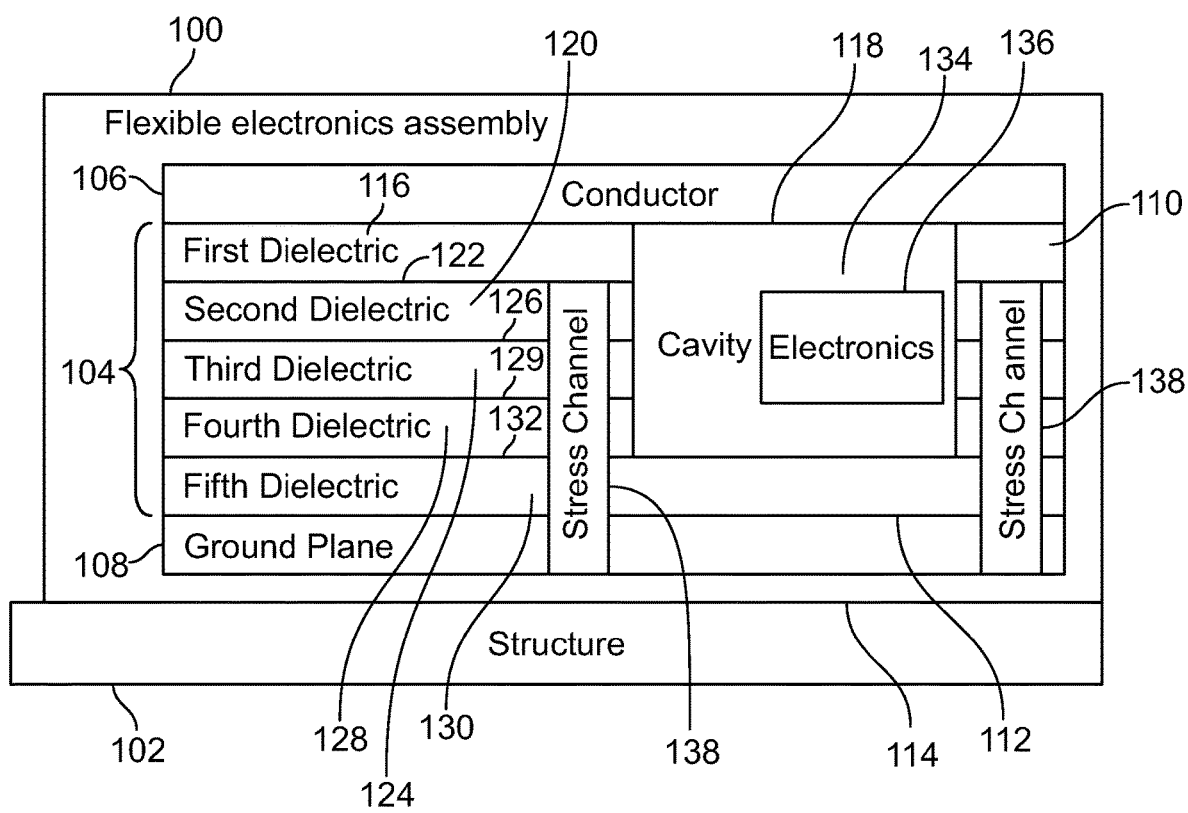
FIG. 1 illustrates a schematic block diagram of a flexible electronics assembly secured to a structure, according to an embodiment of the present disclosure.

FIG. 1 illustrates a schematic block diagram of a flexible electronics assembly 100 secured to a structure 102, according to an embodiment of the present disclosure. In at least one embodiment, the flexible electronics assembly 100 is a flexible circuit board. In at least one embodiment, the structure 102 is a portion of an aircraft, such as a portion of a fuselage, wing, or the like, which may be a non-planar surface. Optionally, the structure 102 may be a portion of various other vehicles (such as automobiles, locomotives, watercraft, spacecraft, or the like), fixed structures (such as residential or commercial buildings, monuments, cellular towers, or the like), or the like. The flexible electronics assembly 100 is secured to a surface of the structure 102, such as through one or more adhesives, fasteners, or the like.

The flexible electronics assembly 100 includes a substrate 104 sandwiched between a conductor 106 and a ground plane 108, such as a first ground plane (or optionally a second ground plane). In at least one embodiment, the conductor 106 is disposed over a top surface 110 of the substrate 104, which in turn is disposed over a top surface 112 of the ground plane 108. The ground plane 108 is disposed over an outer surface 114 of the structure 102. The outer surface 114 may include one or more non-planar, arcuate, curved, or other such non-flat portions. The flexible electronics assembly 100 is configured to conform to the outer surface 114, such as through flexing, bending, and the like.

In at least one embodiment, the substrate 104 is a multi-layer structure including a plurality of dielectric layers or boards. For example, the substrate 104 includes a first dielectric 116 (such as a first dielectric layer or board) secured to a lower surface 118 of the conductor 106. A second dielectric 120 (such as a second dielectric layer or board) is secured to a lower surface 122 of the first dielectric 116. A third dielectric 124 (such as a third dielectric layer or board) is secured to a lower surface 126 of the second dielectric 120. A fourth dielectric 128 (such as a fourth dielectric layer or board) is secured to a lower surface 129 of the third dielectric 124. A fifth dielectric 130 (such as a fifth dielectric layer or board) is secured to a lower surface 132 of the fourth dielectric 128. As shown in FIG. 1, the substrate 104 includes five dielectric layers or boards. Optionally, the substrate 104 can include more (such as six or more) or less (such as two, three, or four) dielectric layers or boards. Further, the substrate 104 may include additional ground planes (for example, a second ground plane between the first and second dielectrics) and/or other routing layers (such as for routing power lines, control lines, and the like).

A cavity 134 is formed in the substrate 104. In at least one embodiment, the cavity 134 extends through portions of the first dielectric 116, the second dielectric 120, the third dielectric 124, and the fourth dielectric 128. As shown, the cavity 134 may not extend into the fifth dielectric 130. Optionally, the cavity 134 may extend into an upper portion of the fifth dielectric 130. The cavity 134 does not extend to the ground plane 108.

An electronics component 136 is secured within the cavity 134. The electronics component 136 may be one or more of an integrated circuit, a processor, a power amplifier, a pre-amplifier, a mixer, a filter, an attenuator, or the like.

One or more stress channels 138 are formed through portions of the substrate 104. The stress channels 138 extend through portions of the second dielectric 120, the third dielectric 124, the fourth dielectric 128, the fifth dielectric 130, and the ground plane 108. As shown, the stress channels 138 may not extend into the first dielectric 116. Optionally, the stress channels 138 may extend into lower portions of the first dielectric 116.

As shown, each stress channel 138 is offset from the cavity 134. For example, the stress channels 138 may be spaced apart from sides or ends of the cavity 134. The stress channels 138 increase flexibility of the flexible electronics assembly 100, and provide spring-like resiliency that allows the flexible electronics assembly 100 to conform to a surface of the structure 102.

The flexible electronics assembly 100 may include more or less stress channels 138 than shown. For example, the flexible electronics assembly 100 may include a single stress channel 138. As another example, the flexible electronics assembly 100 may include four or more stress channels 138. The size, shape, and number of stress channels 138 may vary based on a desired amount of flexibility for the flexible electronics assembly 100.

Accordingly, the flexible electronics assembly 100 includes the substrate 104, which includes one or more dielectrics 116, 120, 124, 128, and/or 130. The cavity 134 cavity is formed within the substrate 104. The ground plane 108 is secured to the substrate 104. One or more stress channels 138 are formed through one or more portions of the substrate 104 and the ground plane 108. The electronics component 136 is disposed within the cavity 134. In at least one embodiment, the stress channels 138 define open interior spaces, voids, or the like.

It is to be understood that terms first, second, third, fourth, fifth, etc. are merely for labeling purposes. A first dielectric may be a second dielectric, or vice versa, and so on. Similarly, a first ground plane may be a second ground plane, or vice versa.

Figure 2:
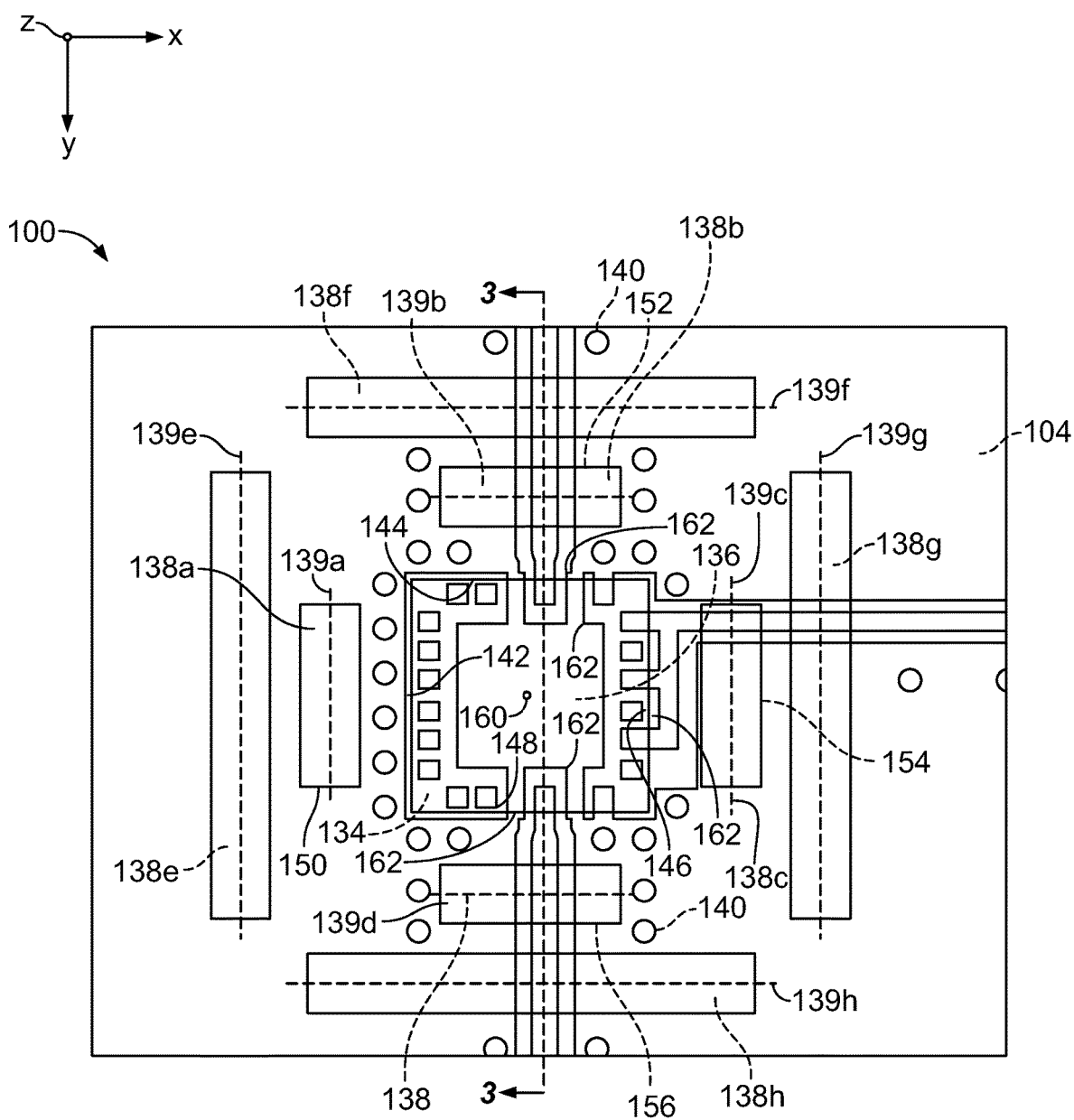
FIG. 2 illustrates a top view of the flexible electronics assembly, according to an embodiment of the present disclosure.

FIG. 2 illustrates a top view of the flexible electronics assembly 100, according to an embodiment of the present disclosure. In at least one embodiment, the flexible electronics assembly 100 includes a plurality of interconnects, such as vias 140, such as within the substrate 104.

The flexible electronics assembly 100 includes a first inboard stress channel 138a offset from a first side 142 of the cavity 134, a second inboard stress channel 138b offset from a second side 144 of the cavity 134, a third inboard stress channel 138c offset from a third side 146 of the cavity 134, and a fourth inboard stress channel 138d offset from a fourth side 148 of the cavity 134. The first inboard stress channel 138a has a longitudinal axis 139a that may be parallel to a longitudinal axis 139c of the third inboard stress channel 138c. The second inboard stress channel 138b has a longitudinal axis 139b that may be parallel to a longitudinal axis 139d of the fourth inboard stress channel 138d. The longitudinal axes 139a and 139c may be perpendicular to the longitudinal axes 139b and 139d. Accordingly, the first inboard stress channel 138a and the third inboard stress channel 138c provide resilient flexibility to the flexible electronics assembly 100 with respect to planes parallel to an X-Z plane, and the second inboard stress channel 138b and the fourth inboard stress channel 138d provide resilient flexibility to the flexible electronics assembly 100 with respect to planes parallel to a Y-Z plane.

The first, second, third, and fourth inboard stress channels 138a-d may have lengths that are equal to or less than lengths of respective sides 142, 144, 146, and 148 of the cavity 134. Optionally, the first, second, third, and fourth inboard stress channels 138a-d may have lengths that exceed lengths of respective sides 142, 144, 146, and 148 of the cavity 134.

The first, second, third, and fourth inboard stress channels 138a-d may be shaped as linear rectangular openings within the substrate 104. As another example, the first, second, third, and fourth inboard stress channels 138a-d may be shaped as linear cylindrical openings within the substrate 104. As another example, the first, second, third, and fourth inboard stress channels 138a-d may be shaped as curved or arcuate segments. For example, the first, second, third, and fourth inboard stress channels 138a-d may be shaped as semi-circular openings within the substrate 104. Optionally, the flexible electronics assembly 100 can include more or less inboard stress channels than shown. The size, shape, location, and number of the inboard stress channels varies depending on a desired amount of flexibility for the flexible electronics assembly 100.

The flexible electronics assembly 100 also includes a first outboard stress channel 138e offset from an outboard side 150 of the first inboard stress channel 138a, a second outboard stress channel 138f offset from an outboard side 152 of the second inboard stress channel 138b, a third outboard stress channel 138g offset from an outboard side 154 of the third inboard stress channel 138c, and a fourth outboard stress channel 138h offset from an outboard side 156 of the fourth inboard stress channel 138d. Inboard refers to being closer to a central axis 160 of the flexible electronics assembly 100 than outboard. The first outboard stress channel 138e has a longitudinal axis 139e that may be parallel to the longitudinal axis 139a of the first inboard stress channel 138a. The second outboard stress channel 138f has a longitudinal axis 139f that may be parallel to the longitudinal axis 139b of the second inboard stress channel 138b. The third outboard stress channel 138g has a longitudinal axis 139g that may be parallel to the longitudinal axis 139c of the third inboard stress channel 138c. The fourth outboard stress channel 138h has a longitudinal axis 139h that may be parallel to the longitudinal axis 139d of the fourth inboard stress channel 138d. Accordingly, the first outboard stress channel 138e and the third outboard stress channel 138g provide resilient flexibility to the flexible electronics assembly 100 with respect to planes parallel to an X-Z plane, and the second outboard stress channel 138f and the fourth outboard stress channel 138h provide resilient flexibility to the flexible electronics assembly 100 with respect to planes parallel to a Y-Z plane.

The first, second, third, and fourth outboard stress channels 138e-h may have lengths that are greater than the lengths of the first, second, third, and fourth inboard stress channels 138a-d. For example, the first, second, third, and fourth outboard stress channels 138e-h may be at least twice the length of the first, second, third, and fourth inboard stress channels 138a-d. Optionally, the first, second, third, and fourth outboard stress channels 138e-h may have lengths that are less than shown, such as equal to or less than lengths of the first, second, third, and fourth inboard stress channels 138a-d.

The first, second, third, and fourth outboard stress channels 138e-h may be shaped as linear rectangular openings within the substrate 104. As another example, the first, second, third, and fourth outboard stress channels 138e-h may be shaped as linear cylindrical openings within the substrate 104. As another example, the first, second, third, and fourth outboard stress channels 138e-h may be shaped as curved or arcuate segments. For example, the first, second, third, and fourth outboard stress channels 138e-h may be shaped as semi-circular openings within the substrate 104. Optionally, the flexible electronics assembly 100 can include more or less outboard stress channels than shown. The size, shape, location, and number of the outboard stress channels varies depending on a desired amount of flexibility for the flexible electronics assembly 100.

As shown the inboard stress channels 138a, 138b, 138c, and 138d are between the respective outboard stress channels 138e, 138f, 138g, and 138h and the cavity 134. The inboard stress channels 138a, 138b, 138c, and 138d are closer to the cavity 134 than the respective outboard stress channels 138e, 138f, 138g, and 138h.

It has been found that the flexible electronics assembly 100 including the four inboard stress channels 138a-d and the four outboard stress channels 138e-h, as shown in FIG. 2, provides a highly desirable amount of flexibility to the flexible electronics assembly 100. The four inboard stress channels 138a-d and the four outboard stress channels 138e-h, as shown in FIG. 2, provide flexibility that ensures that the various connection joints at, on, or proximate to the electronics component 136 and/or the cavity 134 are protected from excessive mechanical stress.

Optionally, the flexible electronics assembly 100 may include the inboard stress channels, but not outboard stress channels, or vice versa. As another example, the flexible electronics assembly 100 may include less than all of the inboard stress channels shown and less than all of the outboard stress channels shown.

Mechanical stresses at interconnect interfaces 162 (for example, connection joints) in relation to the electronics component 136 may be high when the flexible electronics assembly 100 is flexed. The stress channels 138 significantly reduce the stress at the interconnect interfaces 162, thereby eliminating, minimizing, or otherwise reducing the potential for joint failure (for example, cracking) of the interconnect interfaces 162.

Figure 3:
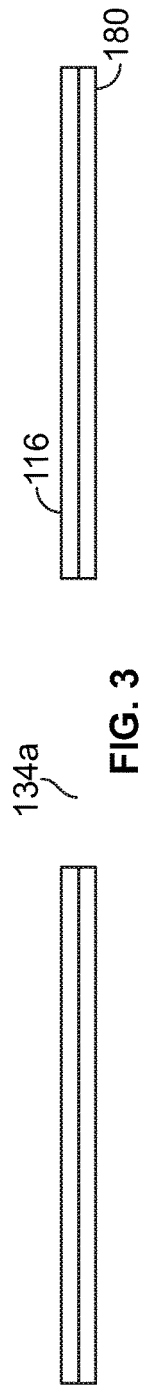
FIG. 3 illustrates a cross-sectional view of a first ground plane secured to a first dielectric through line 3-3 of FIG. 2, according to an embodiment of the present disclosure.

FIG. 3 illustrates a cross-sectional view of a first ground plane 180 secured to the first dielectric 116 through line 3-3 of FIG. 2, according to an embodiment of the present disclosure. Referring to FIGS. 1-3, in at least one embodiment, in order to form the flexible electronics assembly 100, the first ground plane 180 is secured under the first dielectric 116, and a cavity segment 134a is formed through the first ground plane 180 and the first dielectric 116. Optionally, the flexible electronics assembly 100 may not include the first ground plane 180.

Figure 4:
FIG. 4 illustrates a cross-sectional view of a second dielectric through line 3-3 of FIG. 2, according to an embodiment of the present disclosure.

FIG. 4 illustrates a cross-sectional view of the second dielectric 120 through line 3-3 of FIG. 2, according to an embodiment of the present disclosure. A cavity segment 134b and channel segments 238a are formed through the second dielectric 120.

Figure 5:
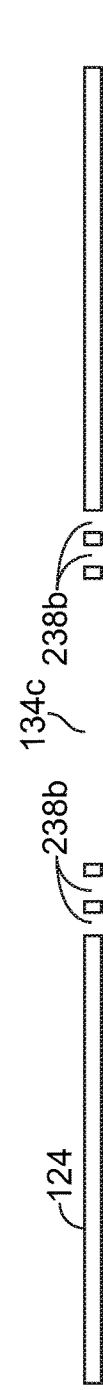
FIG. 5 illustrates a cross-sectional view of a third dielectric through line 3-3 of FIG. 2, according to an embodiment of the present disclosure.

FIG. 5 illustrates a cross-sectional view of the third dielectric 124 through line 3-3 of FIG. 2, according to an embodiment of the present disclosure. A cavity segment 134c and channel segments 238b are formed through the third dielectric 124.

Figure 6:
FIG. 6 illustrates a cross-sectional view of a fourth dielectric through line 3-3 of FIG. 2, according to an embodiment of the present disclosure.

FIG. 6 illustrates a cross-sectional view of the fourth dielectric 128 through line 3-3 of FIG. 2, according to an embodiment of the present disclosure. A cavity segment 134d and channels segments 238c are formed through the fourth dielectric 128.

Figure 7:
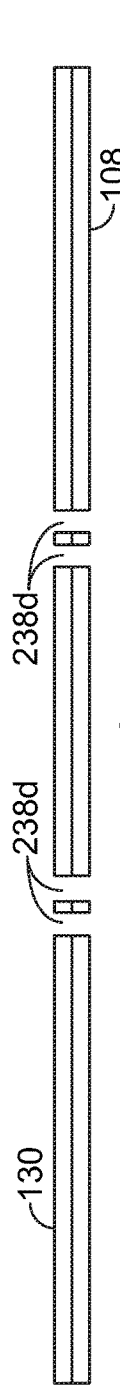
FIG. 7 illustrates a cross-sectional view of a fifth dielectric secured to a second ground plane, according to an embodiment of the present disclosure.

FIG. 7 illustrates a cross-sectional view of the fifth dielectric 130 secured to the (second) ground plane 108, according to an embodiment of the present disclosure. Channel segments 238d are formed through the fifth dielectric 130 and the second ground plane 108.

Figure 8:
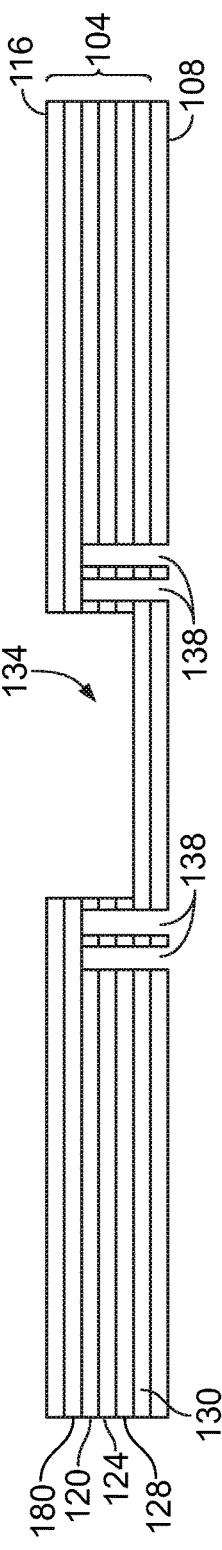
FIG. 8 illustrates a cross-sectional view of a substrate through line 3-3 of FIG. 2, according to an embodiment of the present disclosure.

FIG. 8 illustrates a cross-sectional view of the substrate 104 through line 3-3 of FIG. 2, according to an embodiment of the present disclosure. Referring to FIGS. 1-8, the first, second, third, fourth, and fifth dielectrics 116, 120, 124, 128, and 130 are secured together, such as by lamination. The cavity segments 134a-d are aligned with one another to form the cavity 134. Respective channels segments 238a-d align with one another to form the respective stress channels 138.

FIG. 9 illustrates a cross-sectional view of the vias 140 formed in the substrate 104 between the first dielectric 116 and the second ground plane 108 through line 3-3 of FIG. 2, according to an embodiment of the present disclosure. Interconnect channels may be formed within the substrate 104 and filled with conductive ink or electroplated to form the vias 140.

FIG. 10 illustrates a cross-sectional view of the electronics component 136 disposed within the cavity 134 of the flexible electronics assembly 100, through line 3-3 of FIG. 2, according to an embodiment of the present disclosure. The electronics component 136 is placed within the cavity 134 so that the conductive pads 182 face upward.

FIG. 11 illustrates a cross-sectional view of the conductor 106 disposed over the substrate 104 through line 3-3 of FIG. 2, according to an embodiment of the present disclosure. The conductor 106 further connects to the conductive pads 182 at interconnect interfaces 162 (or connection joints).

Figure 12:
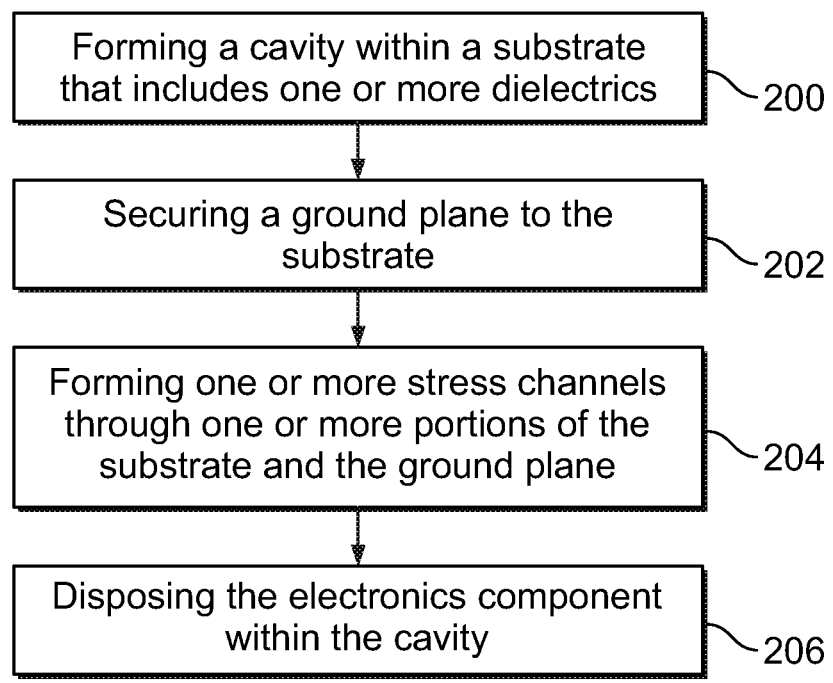
FIG. 12 illustrates a flow chart of a method of forming a flexible electronics assembly, according to an embodiment of the present disclosure.

FIG. 12 illustrates a flow chart of a method of forming a flexible electronics assembly. Referring to FIGS. 1-12, the method includes forming, at 200, the cavity 134 within the substrate 104 that includes one or more dielectrics 116, 120, 124, 128, and 130; securing, at 202, the ground plane 108 to the substrate 104; forming, at 204, one or more stress channels 138 through one or more portions of the substrate 104 and the ground plane 108; and disposing, at 206, the electronics component 136 within the cavity 134.

In at least one embodiment, the method also includes securing the conductor 106 to the substrate 104. Said securing the conductor 106 to the substrate 104 includes disposing the substrate 104 between the conductor 106 and the ground plane 108.

In at least one embodiment, said forming the cavity 134 includes extending the cavity 134 through portions of the first dielectric 116, the second dielectric 120, the third dielectric 124, and the fourth dielectric 128.

In at least one embodiment, said forming the one or more stress channels 138 includes extending the one or more stress channels 138 through portions of the second dielectric 120, the third dielectric 124, the fourth dielectric 128, the fifth dielectric 130, and the ground plane 108.

In at least one embodiment, the method also includes securing the ground plane 180 to the first dielectric 116.

In at least one embodiment, said forming the one or more stress channels 138 includes offsetting the one or more stress channels 138 from the cavity 134.

In at least one embodiment, said forming the one or more stress channels 138 includes forming one or more inboard stress channels 138a, 138b, 138c, and/or 138d, and forming one or more outboard stress channels 138e, 138f, 138g, and/or 138h. The inboard stress channels 138a, 138b, 138c, and/or 138d are closer to the cavity 134 than the one or more outboard stress channels 138e, 138f, 138g, and/or 138h.

In at least one embodiment, said forming the inboard stress channels 138a, 138b, 138c, and/or 138d includes offsetting the first inboard stress channel 138a from the first side 142 of the cavity 134; offsetting the second inboard stress channel 138*b* from the second side 144 of the cavity 134; offsetting the third inboard stress channel 138*c* from the third side 146 of the cavity 134; and offsetting the fourth inboard stress channel 138*d* from the fourth side 148 of the cavity 134.

In at least one embodiment, said forming the one or more outboard stress channels 138*e*, 138*f*, 138*g*, and/or 138*h* includes offsetting the first outboard stress channel 138*e* from the first inboard stress channel 138*a*; offsetting the second outboard stress channel 138*f* from the second inboard stress channel 138*b*; offsetting the third outboard stress channel 138*g* from the third inboard stress channel 138*c*; and offsetting the fourth outboard stress channel 138*h* from the fourth inboard stress channel 138*d*.

Figure 13:
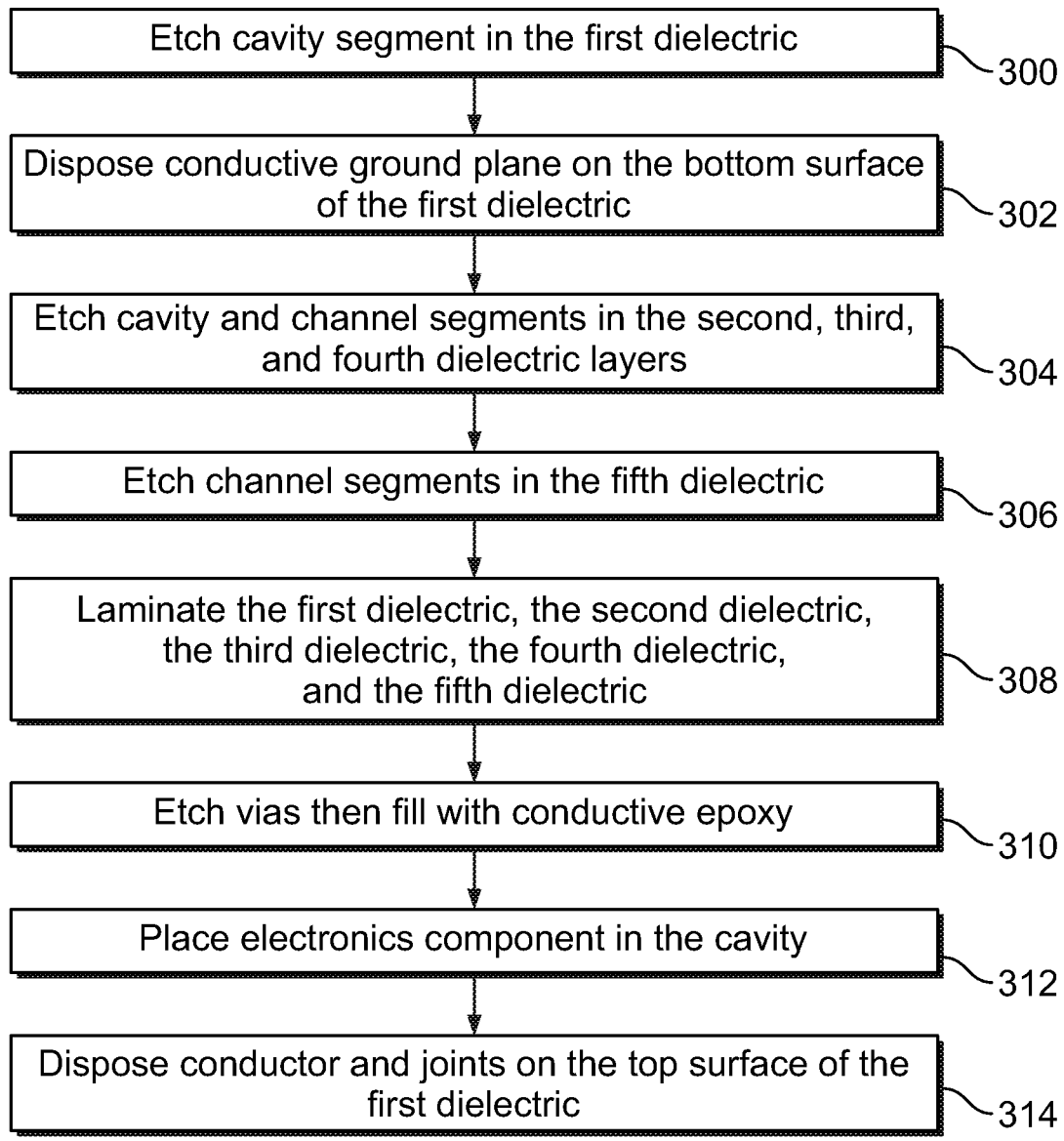
FIG. 13 illustrates a flow chart of a method of forming a flexible electronics assembly, according to an embodiment of the present disclosure.

FIG. 13 illustrates a flow chart of a method of forming a flexible electronics assembly, according to an embodiment of the present disclosure. Referring to FIGS. 1-13, at 300, a cavity segment is etched in the first dielectric 116. At 302, the first (or optionally second) ground plane 180 is disposed on a bottom surface of the first dielectric 116. At 304, cavity segments and the channel segments are etched into the second, third, and fourth dielectrics 120, 124, and 128. At 306, channel segments are etched into the fifth dielectric 130. At 308, the first dielectric 116, the second dielectric 120, the third dielectric 124, the fourth dielectric 128, and the fifth dielectric 130 are laminated together. At 310, the vias 140 are formed in the substrate 104, such as through etching interconnect passages and filling them with conductive epoxy. At 312, the electronics component 136 is placed within the cavity 134 formed by the aligned cavity segments. At 314, the conductor 106 and connection joints are disposed on a top surface of the first dielectric 116.

Figure 14:
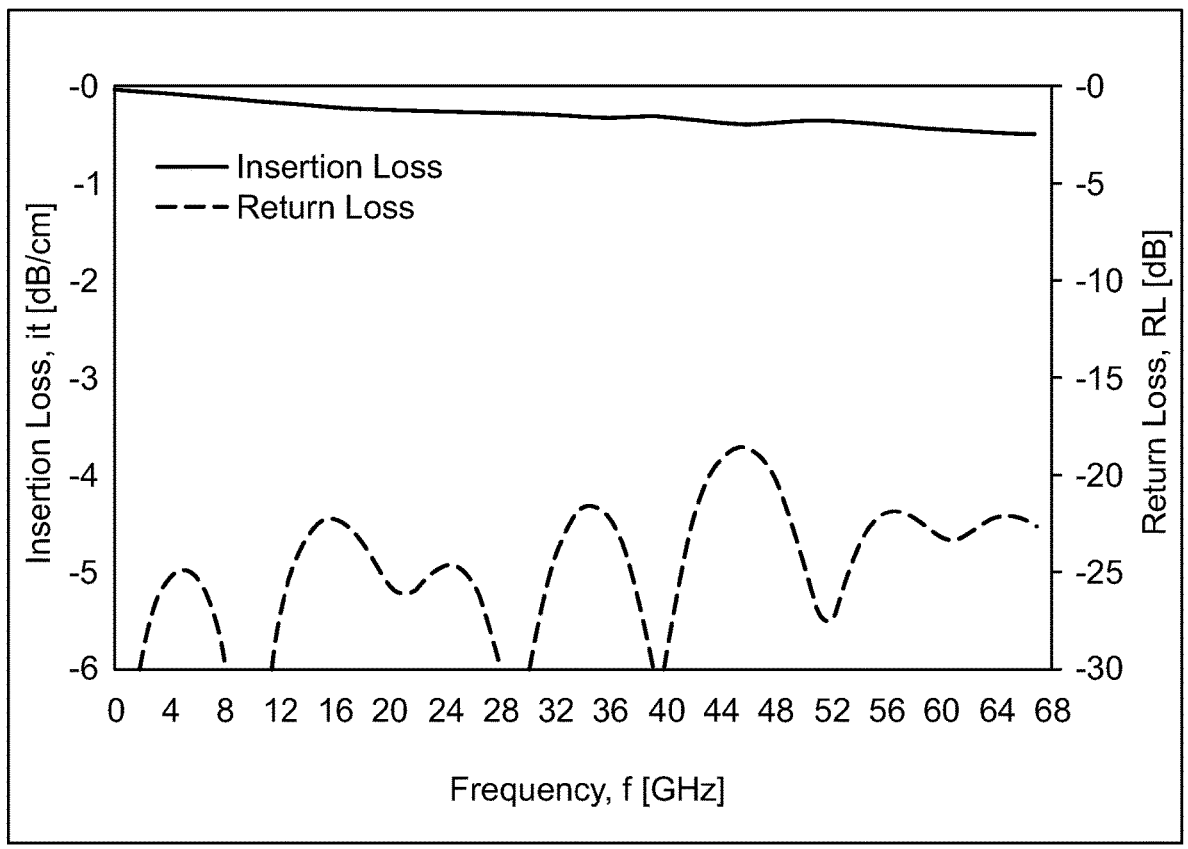
FIG. 14 illustrates a graph of insertion loss and return loss as a function of frequency for a flexible electronics assembly, according to an embodiment of the present disclosure.

FIG. 14 illustrates a graph of insertion loss and return loss as a function of frequency for a flexible electronics assembly, according to an embodiment of the present disclosure. A numerical model of a low-loss printed grounded coplanar waveguide (GCPW) with a length of 10 mm was developed using a finite element method (FEM) solver to predict performance. In an example, the model for the low loss printed GCPW predicts an insertion loss of ~0.47 dB/cm up to 67 GHz and maintains a VSWR less than 1.27:1 across an entire frequency range of 67 GHz.

As described herein, embodiments of the present disclosure provide an effective method for forming an electronics assembly, such as an FHE assembly, having improved flexibility. Further, embodiments of the present disclosure provide a cost-effective method of forming an electronics assembly, such as an FHE assembly.

While various spatial and directional terms, such as top, bottom, lower, mid, lateral, horizontal, vertical, front and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc., are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various embodiments of the disclosure, including the best mode, and also to enable any person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. A flexible electronics assembly, comprising:
   a substrate comprising one or more dielectrics, wherein a cavity is formed within the substrate;
   a first ground plane secured to the substrate;
   stress channels, each of which is separate and distinct from the cavity, wherein each of the stress channels is formed through (a) one or more portions of the substrate and (b) one or more portions of the first ground plane; and
   an electronics component disposed within the cavity.

2. The flexible electronics assembly of claim 1, further comprising a conductor secured to the substrate.

3. The flexible electronics assembly of claim 1, wherein the one or more dielectrics comprise:
   a first dielectric;
   a second dielectric secured to the first dielectric;
   a third dielectric secured to the second dielectric;
   a fourth dielectric secured to the third dielectric; and
   a fifth dielectric secured to the fourth dielectric.

4. The flexible electronics assembly of claim 3, wherein the cavity extends through portions of the first dielectric, the second dielectric, the third dielectric, and the fourth dielectric.

5. The flexible electronics assembly of claim 3, wherein the stress channels extend through portions of the second dielectric, the third dielectric, the fourth dielectric, the fifth dielectric, and the first ground plane.

6. The flexible electronics assembly of claim 3, further comprising:
  a second ground plane secured to the first dielectric; and
  one or more vias, which are separate and distinct from the cavity and the stress channels, connecting the first ground plane to the second ground plane.

7. The flexible electronics assembly of claim 1, wherein the stress channels are offset from the cavity.

8. The flexible electronics assembly of claim 1, wherein the stress channels comprise:
  one or more inboard stress channels; and
  one or more outboard stress channels;
  wherein the one or more inboard stress channels are closer to the cavity than the one or more outboard stress channels.

9. The flexible electronics assembly of claim 8, wherein the one or more inboard stress channels comprise:
  a first inboard stress channel offset from a first side of the cavity;
  a second inboard stress channel offset from a second side of the cavity;
  a third inboard stress channel offset from a third side of the cavity; and
  a fourth inboard stress channel offset from a fourth side of the cavity.

10. The flexible electronics assembly of claim 9, wherein the one or more outboard stress channels comprise:
  a first outboard stress channel offset from the first inboard stress channel;
  a second outboard stress channel offset from the second inboard stress channel;
  a third outboard stress channel offset from the third inboard stress channel; and
  a fourth outboard stress channel offset from the fourth inboard stress channel.

11. A method of forming a flexible electronics assembly, the method comprising:
  forming a cavity within a substrate comprising one or more dielectrics;
  securing a first ground plane to the substrate;
  forming stress channels, each of which is separate and distinct from the cavity, wherein each of the stress channels is formed through (a) one or more portions of the substrate and (b) one or more portions of the first ground plane; and
  disposing an electronics component within the cavity.

12. The method of claim 11, further comprising securing a conductor to the substrate, wherein said securing the conductor to the substrate comprises disposing the substrate between the conductor and the first ground plane.

13. The method of claim 11, wherein the one or more dielectrics comprise:
  a first dielectric;
  a second dielectric secured to the first dielectric;
  a third dielectric secured to the second dielectric;
  a fourth dielectric secured to the third dielectric; and
  a fifth dielectric secured to the fourth dielectric.

14. The method of claim 13, wherein said forming the cavity comprises extending the cavity through portions of the first dielectric, the second dielectric, the third dielectric, and the fourth dielectric.

15. The method of claim 13, wherein said forming the stress channels comprises extending the stress channels through portions of the second dielectric, the third dielectric, the fourth dielectric, the fifth dielectric, and the first ground plane.

16. The method of claim 13, further comprising:
  securing a second ground plane to the first dielectric; and
  connecting the first ground plane to the second ground plane with one or more vias, which are separate and distinct from the cavity and the stress channels.

17. The method of claim 11, wherein said forming the stress channels comprises offsetting the stress channels from the cavity.

18. The method of claim 11, wherein said forming the stress channels comprises:
  forming one or more inboard stress channels; and
  forming one or more outboard stress channels;
  wherein the one or more inboard stress channels are closer to the cavity than the one or more outboard stress channels.

19. The method of claim 18, wherein said forming the one or more inboard stress channels comprises:
  offsetting a first inboard stress channel from a first side of the cavity;
  offsetting a second inboard stress channel from a second side of the cavity;
  offsetting a third inboard stress channel from a third side of the cavity; and
  offsetting a fourth inboard stress channel from a fourth side of the cavity.

20. The method of claim 19, wherein said forming the one or more outboard stress channels comprises:
  offsetting a first outboard stress channel from the first inboard stress channel;
  offsetting a second outboard stress channel from the second inboard stress channel;
  offsetting a third outboard stress channel from the third inboard stress channel; and
  offsetting a fourth outboard stress channel from the fourth inboard stress channel.

21. A flexible electronics assembly, comprising:
  a substrate comprising a first dielectric, a second dielectric secured to the first dielectric, a third dielectric secured to the second dielectric, a fourth dielectric secured to the third dielectric, and a fifth dielectric secured to the fourth dielectric, wherein a cavity extends through portions of the first dielectric, the second dielectric, the third dielectric, and the fourth dielectric;
  a first ground plane secured to the fifth dielectric;
  one or more stress channels, which are separate and distinct from the cavity, formed through one or more portions of the substrate and the first ground plane, wherein the one or more stress channels are offset from the cavity, wherein the one or more stress channels extend through portions of the second dielectric, the third dielectric, the fourth dielectric, the fifth dielectric, and the first ground plane;
  an electronics component disposed within the cavity;
  a conductor secured to the substrate, wherein the substrate is disposed between the conductor and the first ground plane;
  a second ground plane secured to the first dielectric; and
  one or more vias, which are separate and distinct from the cavity and the one or more stress channels, connecting the first ground plane to the second ground plane.

22. The flexible electronics assembly of claim 1, wherein each of the stress channels is devoid of the electronics component or any other electronics component.

23. The method of claim 11, wherein each of the stress channels is devoid of the electronics component or any other electronics component.

24. The flexible electronics assembly of claim 1, wherein the stress channels are devoid of vias.

* * * * *